United States Patent
Takeuchi et al.

(10) Patent No.: US 7,287,321 B2
(45) Date of Patent: Oct. 30, 2007

(54) MULTI-LAYER BOARD MANUFACTURING METHOD

(75) Inventors: Satoshi Takeuchi, Nagoya (JP); Motoki Shimizu, Nagoya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 11/211,526

(22) Filed: Aug. 26, 2005

(65) Prior Publication Data

US 2006/0042078 A1    Mar. 2, 2006

(30) Foreign Application Priority Data

Sep. 1, 2004  (JP) .............................. 2004-254868

(51) Int. Cl.
    *K05K 3/30* (2006.01)
(52) U.S. Cl. ............................ 29/834; 29/841; 29/851; 174/260; 257/790; 361/763
(58) Field of Classification Search .......... 29/830–834, 29/841, 846, 851, 852; 174/255, 259, 260, 174/262; 257/790; 361/738, 748, 761, 763, 361/764
See application file for complete search history.

(56) References Cited

U.S. PATENT DOCUMENTS

| | | | |
|---|---|---|---|
| 6,359,235 B1 * | 3/2002 | Hayashi | 174/260 |
| 6,512,182 B2 * | 1/2003 | Takeuchi et al. | 29/846 |
| 6,680,441 B2 | 1/2004 | Kondo et al. | |
| 6,928,726 B2 * | 8/2005 | Zollo et al. | 29/832 |
| 7,022,399 B2 * | 4/2006 | Ogawa et al. | 174/264 |
| 2004/0091687 A1 | 5/2004 | Kondo et al. | |

FOREIGN PATENT DOCUMENTS

| | | |
|---|---|---|
| JP | A-5-335742 | 12/1993 |
| JP | A-2003-332482 | 11/2003 |

\* cited by examiner

*Primary Examiner*—Minh Trinh
*Assistant Examiner*—Donghai D Nguyen
(74) *Attorney, Agent, or Firm*—Posz Law Group, PLC

(57) ABSTRACT

Two types of resin films are prepared for manufacturing a multi-layer board containing a chip component. A fist type has a via hole for the chip component to be inserted into, while a second type does not have the via hole. Resin films including the two types are piled before the chip component is inserted. At least a given resin film of the first type has a via hole provided with protruding members. Of the protruding members, opposing protruding members form a gap between their tips. This gap is shorter than an outer dimension of the inserted chip component. The chip component crushes portion of the tips of the protruding members while being pressed and inserted into the via hole in the given resin film.

8 Claims, 5 Drawing Sheets

MULTI-LAYER BOARD MANUFACTURING METHOD

CROSS REFERENCE TO RELATED APPLICATIONS

This application is based on and incorporates herein by reference Japanese Patent Application No. 2004-254868 filed on Sep. 1, 2004.

FIELD OF THE INVENTION

The present invention relates to a manufacturing method of a multi-layer board where a chip component is embedded in an insulating substrate.

BACKGROUND OF THE INVENTION

Patent Document 1 describes a method of manufacturing a multi-layer board (printed circuit board) so that a chip component is embedded in an insulating substrate (or base member). Here, multiple single-sided conductive pattern resin films made of thermoplastic resin are provided with via holes. The via holes are disposed in positions corresponding to the embedded chip component (or electrical element) to have dimensions approximately equal to an outer dimension of the chip component. Then the multiple resin films are piled, and the chip component is inserted into a concave space (or hole) formed by the via holes. A heating press is then applied to the piled films from both the surfaces. Thus, the individual resin films are deformed while being thermally fused and mutually bonded to thereby produce the insulating substrate, enabling the chip component to be embedded in the insulating substrate.

Patent Document 1: JP2003-86949 A (U.S. Pat. No. 6,680,441 B2)

Here, the multiple resin films having the via holes are piled to have the same height as that of the chip component. To insert the chip component to the concave space with a high yield ratio, the dimensions of the via holes are formed to have slightly larger dimensions in consideration of a deviation of the outer dimension of the chip component, a processing accuracy of the via holes, and a mounting position accuracy of the chip component. In this case, a clearance is formed between the chip component and the inside wall of the concave space with the chip component being not fixed. The chip component may therefore deviate from a preset position, enter into an interval space between the piled films, or jump up out of the concave space because of vibration during insertion of the chip component or during transfer to a next manufacturing step.

SUMMARY OF THE INVENTION

It is an object of the present invention to provide a multi-layer board manufacturing method solving the above problems. Primarily, in this method, multiple resin films of thermoplastic resin adhere to each other to thereby form an insulating substrate, and a chip component is embedded in the formed insulating substrate. This manufacturing method helps prevent the chip component from deviating from a preset position during manufacturing.

To achieve the above object, a manufacturing method of a multi-layer board that includes an insulating substrate and a chip component embedded in the insulating substrate is provided with the following steps:

a preparing step of preparing a first resin film type included in a plurality of thermoplastic resin-made resin films that includes a via hole into which the chip component is inserted and a second resin film type included in the plurality of resin films that does not include the via hole;

a piling step of forming a resin-film pile including the first resin film type and the second resin film type;

an arranging step of inserting the chip component into the via hole and arranging the chip component in the resin-film pile; and a heating and pressing step of heating and pressing the resin-film pile from both surfaces of the resin-film pile so that each resin film included in the resin-film pile adheres to each other to form the insulating substrate and so that the arranged chip component is embedded in the formed insulating substrate, wherein at least one resin film included in the first resin film type of the resin-film pile includes protruding members whose tips protrude to the via hole, wherein a gap between opposing tips of the protruding members is shorter than an outer dimension of the inserted chip component, and wherein in the arranging step the chip component is pressed and inserted into the via hole to which protruding members protrude while crushing a portion of the opposing tips.

Under this manufacturing method, a via hole of at least one resin film is provided with protruding members that protrude to the via hole. A gap between opposing tips of the protruding members is shorter than an outer dimension of the inserted chip component. Accordingly, while the chip component is pressed and inserted into the via hole provided with the protruding members, the chip component crushes or breaks a portion of the tips of the protruding members. Therefore, the inserted and arranged chip component is fixed by the resin film having the protruding members. As a result, this structure helps prevent the chip component from deviating from a preset position, getting into interval spaces between the piled resin films, or jumping up out of a concave space formed by via holes of resin films, because of vibration during insertion into the concave space or during transfer to a next manufacturing step.

As another aspect of the present invention, a manufacturing method of a multi-layer board that includes an insulating substrate and a chip component embedded in the insulating substrate is provided with the following steps:

a preparing step of preparing a first resin film type included in a plurality of thermoplastic resin-made resin films that includes a via hole into which the chip component is inserted and a second resin film type included in the plurality of resin films that does not include the via hole;

a piling step of forming a resin-film pile including the first resin film type and the second resin film type;

a temporary adhering step of temporarily causing each resin film included in the resin-film pile temporarily adheres to each other by heating and pressing the resin-film pile from both surfaces of the resin-film pile;

an arranging step of inserting the chip component into the via hole and arranging the chip component in the resin-film whose each resin film has temporarily adhered; and a heating and pressing step of heating and pressing the resin-film pile from both surfaces of the resin-film pile so that the each resin film included in the resin-film pile adheres to each other to form the insulating substrate and the arranged chip component is embedded in the formed insulating substrate.

Under this manufacturing method, before a chip component is inserted into a via hole, the resin-film pile is heated and pressed so that each resin film of the pile temporary adheres and is fixed to each other. As a result, this structure helps prevent the chip component from getting into interval spaces between the piled resin films because of vibration during insertion into the concave space or during transfer to a next manufacturing step.

BRIEF DESCRIPTION OF THE DRAWINGS

The above and other objects, features, and advantages of the present invention will become more apparent from the following detailed description made with reference to the accompanying drawings. In the drawings.

DETAILED DESCRIPTION OF THE PREFERRED EMBODIMENTS

Figure 1:
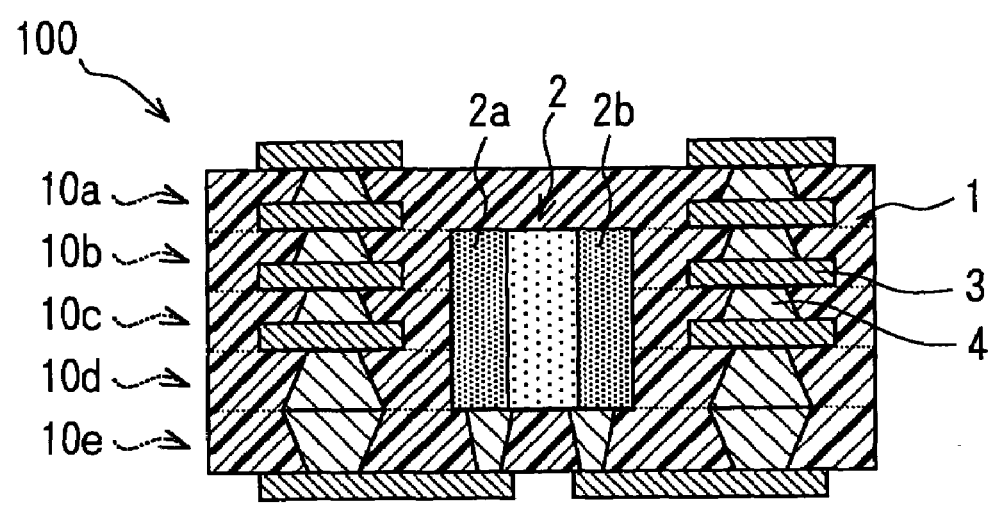
FIG. 1 is a schematic sectional view of a multi-layer board manufactured by a method according to an embodiment of the present invention.

FIG. 1 shows a schematic sectional view of a multi-layer board 100 manufactured by a method according to an embodiment of the present invention. Here, a chip component 2 is shown with electrodes 2a, 2b formed on a surface of the chip component 2 being explicitly shown.

The multi-layer board 100 embeds the chip component 2 inside an insulating substrate (or base member) 1, which is formed by causing five resin films 10a to 10e (divided by dotted lines in FIG. 1) to adhere each other. Further, conductive patterns 3 are formed on some of the resin films 10a to 10e; each of the conductive patterns formed on the individual resin films 10a to 10e is electrically connected each other using conductive members 4 formed by sintering conductive pastes. The electrodes 2a, 2b of the chip component 2 are electrically connected to the conductive patterns 3 via the conductive members 4.

Next, a manufacturing method of the multi-layer board 100 will be explained below with reference to FIGS. 2A to 2F, 3A to 3C, 4A to 4C, and 5A to 5B.

Figure 2A:
FIGS. 2A to 2F are sectional views showing a resin film preparation step of the manufacturing method.

FIGS. 2A to 2F are sectional views showing a resin film preparation step for the resin film 10b. First, the conductive pattern 3 shown in FIG. 2A is formed by the following sub-steps: attaching a metal foil on one surface of a resin film 1 made of liquid crystal polymers being thermoplastic resin; and patterning the metal foil by photolithography and etching. The resin film 1 being the thermoplastic resin can be made of polyetheretherketone (PEEK) resin, polyetherimide (PEI) resin, or a mixture of the two foregoing resins, instead of the liquid crystal polymers. Eventually, multiple thermoplastic resin films 1 adhere (are bonded) to each other to form an insulating substrate 1 shown in FIG. 1. The metal foil forming the conductive patterns 3 is, for instance, a copper foil having both high conductivity and strength.

Figure 2B:
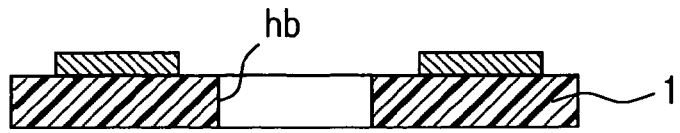

Next, a via hole hb is formed in the resin film 1 by laser processing as shown in FIG. 2B. This via hole hb is used for inserting the chip component 2 shown in FIG. 1.

Figure 2C:
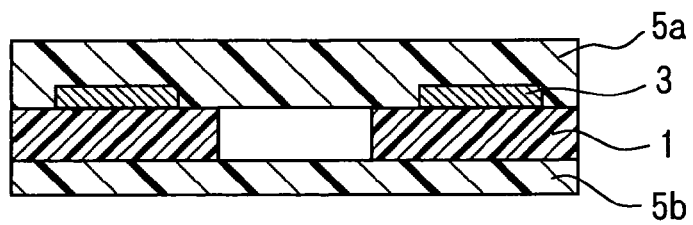

Next, protection films 5a, 5b are attached on both the surfaces of the resin film 1 having the conductive pattern 3 as shown in FIG. 2C. The protection films 5a, 5b are used for preventing damage of the conductive pattern 3 or dirt on surfaces of the resin film 1 due to the conductive paste.

Figure 2D:
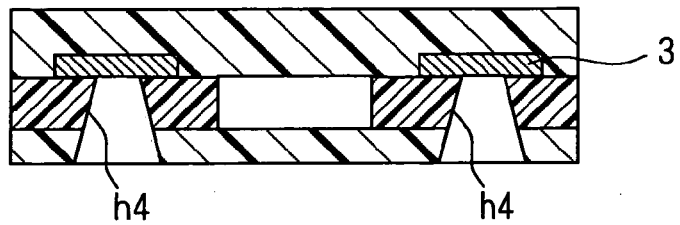

Next, a bottom-having hole h4 is formed by laser processing. This hole 4 has a bottom constituted by the conductive pattern 3 as shown in FIG. 2D.

Figure 2E:
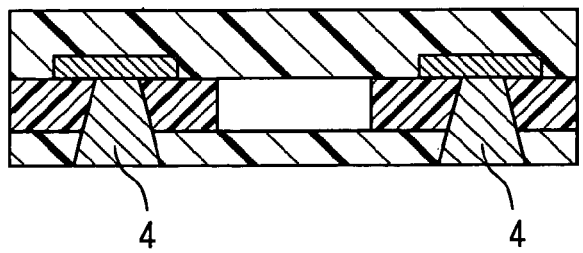
Figure 2F:
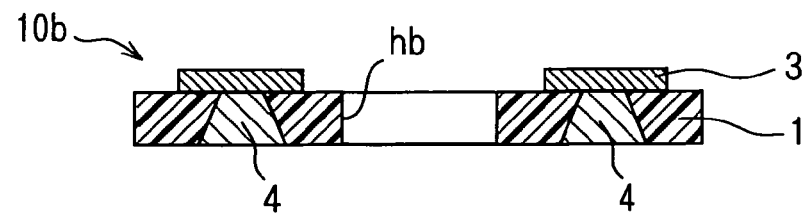

Next, the hole h4 is fulfilled with conductive pastes as shown in FIG. 2E. The conductive pastes are eventually sintered to form the conductive member 4 shown in FIG. 1.

At the last, the protection films 5a, 5b are peeled off and removed, finishing the film preparation step of the resin film 10b. The resin films 10c, 10d are prepared similarly to the resin film 10b. The resin films 10a, 10e are prepared with a step omitting the formation of the via hole shown in FIG. 2B. In other words, in the resin film preparation step, two resin film types of resin films are prepared; namely, a first resin film type includes a resin film such as the resin film 10b, 10c, 10d having a via hole into which a chip component 2 is to be inserted while a second resin film type includes a resin film such as the resin film 10a, 10e not having the via hole.

Figure 3A:
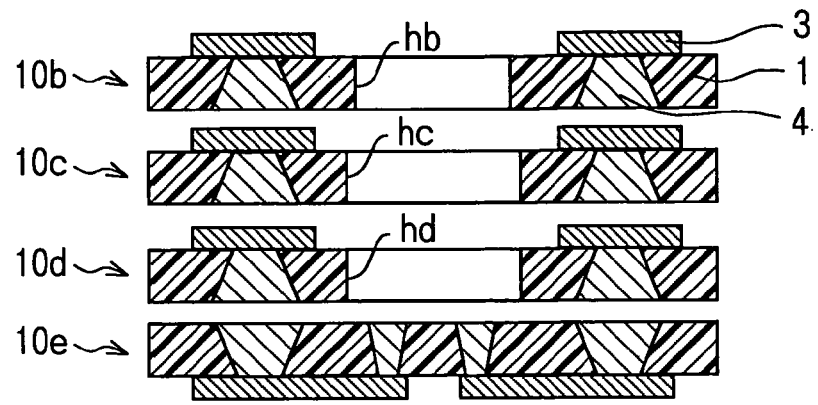
FIGS. 3A to 3C are sectional views showing a chip component arrangement step of the manufacturing method.
Figure 3B:
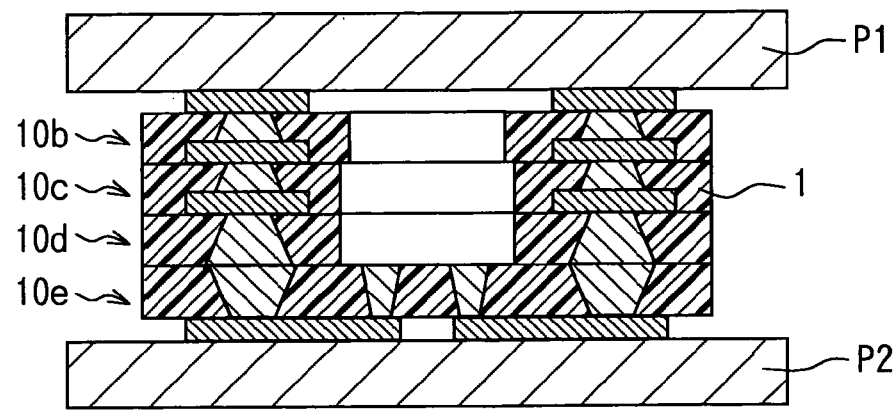
Figure 3C:
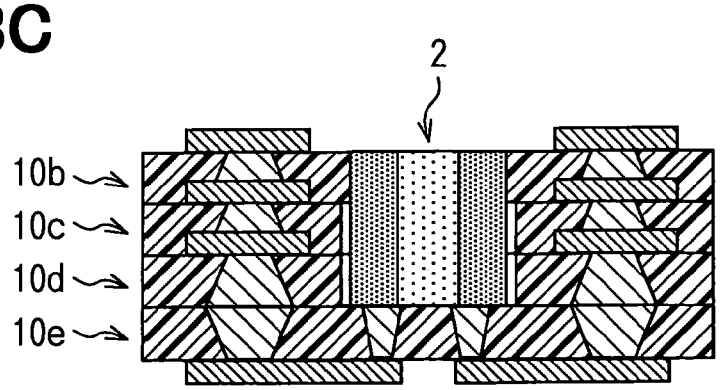

Next, thus prepared resin films 10b to 10e are piled and then the chip component 2 is inserted and arranged, in a chip component arrangement step. FIGS. 3A to 3C are sectional views showing a chip component arrangement step.

The resin films 10b to 10e are piled so that the via holes hb to hd form a concave space as shown in FIG. 3A. The number of resin films piled 10b to 10d varies depending on the height of the chip component 2. Here, the resin film 10e has no via hole. Furthermore, the dimension of the via hole hb in the resin film 10b is different from those of the via holes hc, hd in the resin films 10c, 10d with respect to manufacturing the multi-layer board 100 shown in FIG. 1.

Figure 4A:
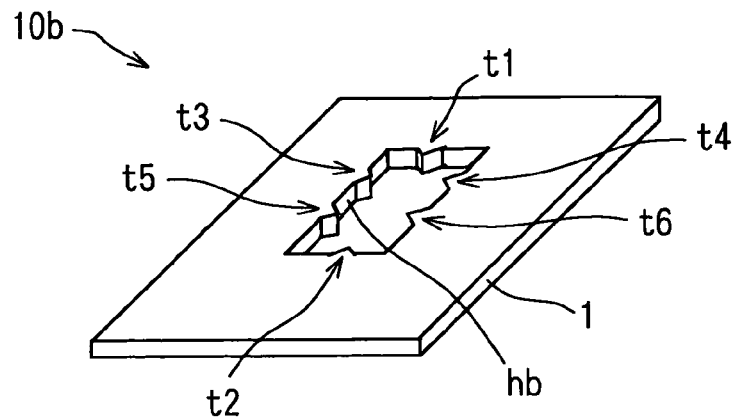
FIGS. 4A to 4C are perspective views showing arrangement of a chip component through a via hole of a resin film having protruding members.
Figure 4B:
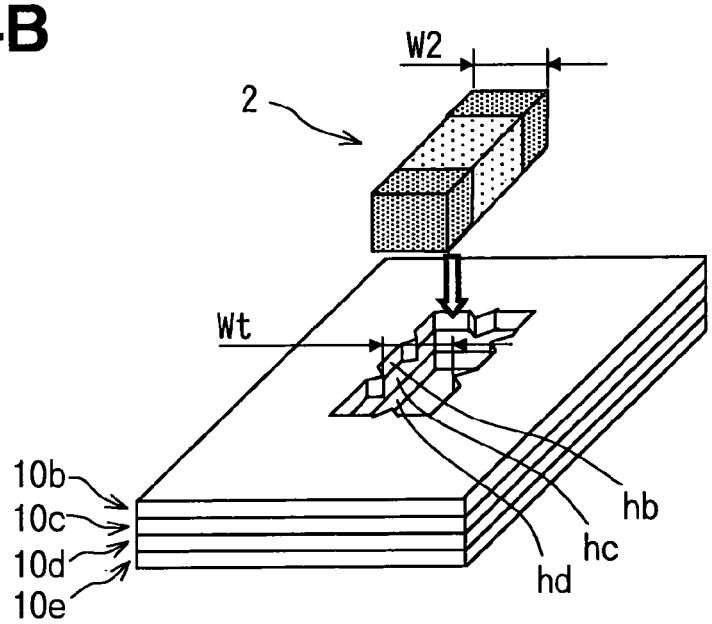
Figure 4C:
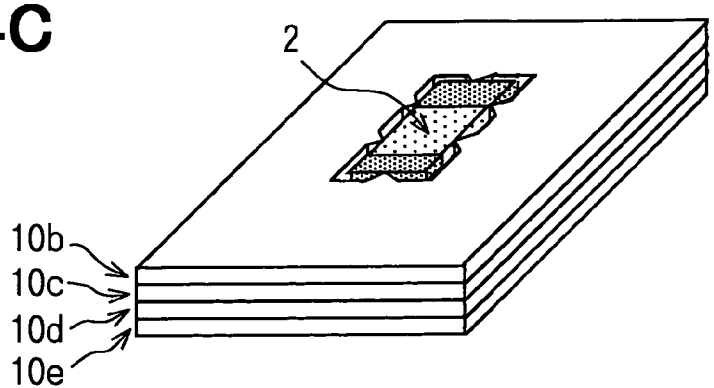

Next, a feature of the present invention will be explained with reference to FIGS. 4A to 4C. FIG. 4A shows a perspective view of the resin film 10b. FIG. 4B shows a step where the chip component 2 is to be inserted into the piled resin films 10b to 10e. FIG. 4C shows a view after the chip component 2 is inserted. Here, details of the conductive patterns 3 and the conductive pastes 4 are removed from the view for simplification.

As shown in FIG. 4A, the via hole hb of the resin film 10b is provided with six protruding members t1 to t6 that protrude to the via hole hb unlike those of the resin films 10c, 10d are. For instance, a gap Wt between tips of mutually opposing protruding members t5, t6 is shorter than an outer dimension W2 of the chip component 2 as shown in FIGS. 4A, 4B. Here, the outer dimension W2 of the chip component 2 is approximately perpendicular to a direction of the insertion of the chip component 2. Therefore, in this chip component arrangement step, the chip component is pressed and inserted into the via holes hb to hd of the resin films 10b to 10e while crushing or breaking portions of the tips of the protruding members t1 to t6 of the resin film 10b. Here, the tips of the protruding members t1 to t6 are elastically deformed.

As shown in FIG. 4C, the chip component 2 that is inserted into the concave space formed of linking the via holes hb to hd is fixed by the resin film 10b having the via hole hb provided with the protruding members t1 to t6. There may be vibration, in areas surrounding the concave space, generated while the chip component 2 is being inserted; there may be vibration generated during transferring to a next manufacturing step. Such vibration may pose a problem that causes the chip component 2 (i) to deviate from a preset position, (ii) to enter an interval space between the piled resin films 10b to 10e, or (iii) to jump up out of the concave space. This embodiment helps prevent such problem from occurring.

A clearance between the via holes hc, hd and the chip component 2 is typically set to 100 micrometers. In contrast, crushed or broken portions of the tips of the protruding members t1 to t6 that are crushed or broken during the insertion of the chip component 2 are designed to have lengths of preferably not less than 10 micrometers and not more than 30 micrometers in a protruding direction (10 μm≦(W2−Wt)/2≦30 μm). When the protruding members t1 to t6 are broken in the portions of their tips, a fixation effect is produced to fix the chip component 2 that is pressed and inserted into the via hole hb. When the broken length of the protruding members t1 to t6 is less than 10 micrometers, the fixation effect decreases. In contrast, when the broken length of the protruding members t1 to t6 is more than 30 micrometers, resistance that occurs during the insertion of the chip component 2 becomes too large for the resin film 10b to be prevented from deforming. The shapes of the protruding members t1 to t6 are preferably triangles having tip angles of 135 degrees with respect to a resin film 1 of liquid crystal polymers (elastic modulus:100 MPa). However, the shapes can be alternatively any other shapes.

In this embodiment shown in FIGS. 3A to 3C, 4A to 4C, only the resin film 10b has the via hole having the protruding members t1 to t6; however, the resin films 10c, 10d can be also provided with protruding members in their via holes hc, hd. The above fixation effect can be obtained when at least one of the resin films 10b, 10c, 10d is provided with the protruding members in its via hole hb, hc, hd.

Insertion of the chip component 2 can be performed under the above condition where the resin films 10b to 10e are only piled; however, alternatively, it can be performed after the resin films 10b to 10e temporarily adhere as explained below.

Back to FIG. 3B, a temporary adhesion step will be explained below. The resin films 10b to 10e piled in a direction and an arrangement shown in FIG. 3A are disposed between a pair of heating-press plates P1, P2 to then be heated and pressed with a relatively low pressure and temperature from both the plates P1, P2, as shown in FIG. 3B. The applied pressure is preferably approximate 2 MPa. The heating temperature is preferably not less than 200 degrees centigrade and not more than 250 degrees centigrade, with respect to a thermoplastic resin film 1 made of liquid crystal polymers. These pressure and temperature enable the surfaces of the resin films 1 to slightly soften. The piled resin films 10b to 10e thereby temporarily adhere with each other. Temperature of less than 200 degrees centigrade decreases adhesion between the resin films 10b to 10e, which causes the piled resin films 10b to 10e that once adhere with each other may easily peel off. In contrast, temperature of more than 250 degrees centigrade may significantly deform not only the resin films 10b to 10e but also the via holes hb to hd.

Next, as shown in FIG. 3C, the chip component 2 is arranged by being inserted into the concave space formed by linking the via holes hb to hd in the resin films 10b to 10e that temporarily adhere. This temporary adhesion step helps prevent the chip component 2 from entering an interval space between the piled resin films 10b to 10e because of vibration during the insertion or transferring to the next step.

Both of providing protruding members to a via hole of at least one resin film of the piled resin films and employing temporary adhesion of resin films have the same effect that helps prevent a chip component 2 from deviating from a preset position during the manufacturing. However, the both act on different objects; namely, the former acts on the chip component 2, while the latter acts on the piled resin films 10b to 10e. Accordingly, employing temporary adhesion of resin films has the effect even on a certain manufacturing method where any via hole is provided with no protruding members. Furthermore, addition, to this certain manufacturing method, of providing protruding members to a via hole of at least one resin film of the piled resin films can further increase the effect that helps prevent the chip component 2 from deviating from a preset position.

Figure 5A:
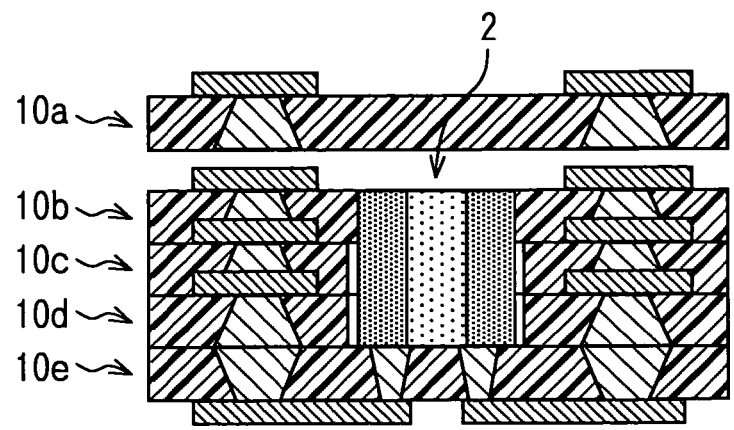
FIGS. 5A to 5B are sectional views showing a step after a chip component arrangement step of the manufacturing method.
Figure 5B:
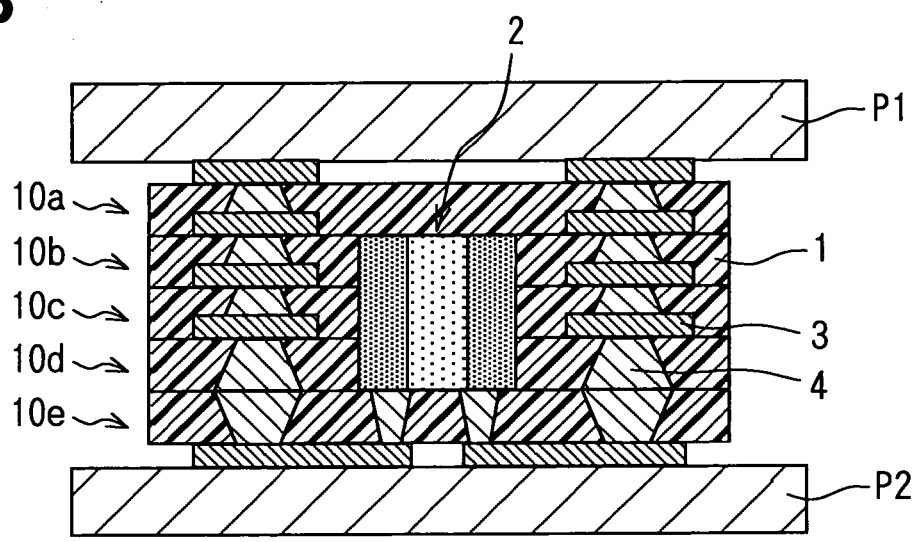

FIGS. 5A, 5B are sectional views showing a step after a chip component 2 is inserted and then arranged. As shown in FIG. 5A, the resin film 10a having no via hole is piled to cover the piled resin films 10b to 10e that temporarily adhere and contain the inserted and arranged chip component 2.

Next, as shown in FIG. 5B, the temporarily adhering resin films 10b to 10e and the resin film 10a that are piled in a direction and an arrangement shown in FIG. 5A are disposed between a pair of heating-press plates P1, P2 with heaters embedded, to be then heated and pressed with a high pressure and temperature from both the plates P1, P2, as shown in FIG. 5B. The applied pressure is preferably approximate 4 MPa. The heating temperature preferably ranges from 300 to 350 degrees centigrade, with respect to a thermoplastic resin film 1 made of liquid crystal polymers. These pressure and temperature enable the thermoplastic resin films 1 to soften. The piled resin films 10a to 10e thereby adhere with each other to thereby form the insulating substrate 1. Furthermore, the resin film 1 flows to enter the whole of a clearance or a gap around the chip component 2, so that the chip component 2 is embedded within the insulating substrate 1. Here, the above heating and pressuring cause the conductive pastes 4 to sinter and thereby form the conductive member 4 for electrically connecting the conductive patterns 3 with each other. Thus, the multi-layer board 100 can be manufactured.

It will be obvious to those skilled in the art that various changes may be made in the above-described embodiments of the present invention. However, the scope of the present invention should be determined by the following claims.

What is claimed is:

1. A manufacturing method of a multi-layer board that includes an insulating substrate and a chip component embedded in the insulating substrate, wherein the insulating substrate is formed by a plurality of resin films made of thermoplastic resin to adhere therebetween, the method comprising:
a preparing step of preparing a first resin film type included in the plurality of resin films that includes a via hole into which the chip component is inserted and a second resin film type included in the plurality of resin films that does not include the via hole;
a piling step of forming a resin-film pile including the first resin film type and the second resin film type;
an arranging step of inserting the chip component into the via hole and arranging the chip component in the resin-film pile; and
a heating and pressing step of heating and pressing the resin-film pile from both surfaces of the resin-film pile so that each resin film included in the resin-film pile adheres to each other to form the insulating substrate and so that the arranged chip component is embedded in the formed insulating substrate,
wherein at least one resin film included in the first resin film type of the resin-film pile includes protruding members whose tips protrude to the via hole, wherein a gap between opposing tips of the protruding members is shorter than an outer dimension of the inserted chip component, and wherein in the arranging step the chip component is pressed and inserted into the via hole to which protruding members protrude while crushing a portion of the opposing tips.

2. The manufacturing method of a multi-layer board of claim 1, wherein a dimension of the portion of the opposing tips that is crushed by the chip component ranges from 10 micrometers to 30 micrometers both inclusive.

3. The manufacturing method of a multi-layer board of claim 1, wherein the piling step includes a temporary adhering step of temporarily causing the each resin film included in the resin-film pile temporarily adheres to each other by heating and pressing the resin-film pile from both surfaces of the resin-film pile.

4. The manufacturing method of a multi-layer board of claim 3, wherein the thermoplastic resin is formed of liquid crystal polymers, and wherein a heating temperature in the temporary adhering step ranges from 200 degrees centigrade to 250 degrees centigrade both inclusive.

5. A manufacturing method of a multi-layer board that includes an insulating substrate and a chip component embedded in the insulating substrate, wherein the insulating substrate is formed by a plurality of resin films made of thermoplastic resin to adhere therebetween, the method comprising:

a preparing step of preparing a first resin film type included in the plurality of resin films that includes a via hole into which the chip component is to be inserted and a second resin film type included in the plurality of resin films that does not include the via hole;

a piling step of forming a resin-film pile including the first resin film type and the second resin film type;

a temporary adhering step of temporarily causing each resin film included in the resin-film pile to temporarily adhere to each other by heating and pressing the resin-film pile from both surfaces of the resin-film pile;

an arranging step of inserting the chip component into the via hole and arranging the chip component in the resin-film pile, the each resin film of which has temporarily adhered; and a heating and pressing step of heating and pressing the resin-film pile from both surfaces of the resin-film pile so that the each resin film included in the resin-film pile adheres to each other to form the insulating substrate and the arranged chip component is embedded in the formed insulating substrate, wherein at least one resin film included in the first resin film type of the resin-film pile includes protruding members whose tips protrude to the via hole, wherein a gap between opposing tips of the protruding members is shorter than an outer dimension of the inserted chip component, and wherein in the arranging step the chip component is pressed and inserted into the via hole to which protruding members protrude while crushing a portion of the opposing tips.

6. The manufacturing method of a multi-layer board of claim 5, wherein the thermoplastic resin is formed of liquid crystal polymers, and wherein a heating temperature in the temporary adhering step ranges from 200 degrees centigrade to 250 degrees centigrade both inclusive; the heating temperature being less than a softening point of the thermoplastic resin, which is lower than a melting point of the thermoplastic resin, thereby inhibiting formation of a mobile hole during the temporary adhering step.

7. The manufacturing method of a multi-layer board of claim 5, wherein a dimension of the portion of the opposing tips that is crushed ranges from 10 micrometers to 30 micrometers both inclusive.

8. The manufacturing method of a multi-layer board of claim 5, wherein the heating and pressing during the temporary adhering step is at a temperature that softens the thermoplastic resin but does not cause the resin film to flow, and wherein the heating and pressing during the heating and pressing step is at a temperature that causes the thermoplastic resin to flow into a gap or clearance around the chip component.

* * * * *